United States Patent [19]

Knickerbocker

[11] 4,152,749

[45] May 1, 1979

[54] MATRIX TERMINAL BLOCK

[75] Inventor: Robert H. Knickerbocker, Chesire, Conn.

[73] Assignee: The Siemon Company, Watertown, Conn.

[21] Appl. No.: 845,598

[22] Filed: Oct. 26, 1977

[51] Int. Cl.² ............................................. H02B 1/04
[52] U.S. Cl. ................................ 361/331; 339/97 P; 179/91 R; 361/416; 361/352
[58] Field of Search ............... 361/331, 332, 380, 416, 361/417, 419, 420, 425, 352, 426; 179/91 R, 91 A, 96–98; 339/97 P, 98, 99 R, 147 R, 198 K

[56] References Cited

U.S. PATENT DOCUMENTS

| | | | |
|---|---|---|---|
| 2,974,258 | 3/1961 | Garthwaite | 339/198 K |
| 3,394,454 | 7/1968 | Logan | 339/97 P |
| 3,539,873 | 11/1970 | Rosenberg | 361/416 |
| 3,820,055 | 6/1974 | Huffnagle | 339/97 P |
| 3,887,259 | 6/1975 | Ayer | 361/426 |
| 3,899,237 | 8/1975 | Brigg, Jr. | 339/99 R |

OTHER PUBLICATIONS

A Proven Route to Profitable Connections, Siemon Company, Cat. 1/76, pp. 1,2,14,15,22,23.

Primary Examiner—Gerald P. Tolin

[57] ABSTRACT

An electrical circuit element which defines a conductor matrix having column and row conductors is characterized by field repairability and ease of programming and reprogramming. The circuit element comprises a matrix terminal block which serves as a housing for commonly bussed individual terminal elements and plural integral multiple terminal elements.

9 Claims, 6 Drawing Figures

MATRIX TERMINAL BLOCK

BACKGROUND OF THE INVENTION

1. Field of the Invention

The present invention relates to terminal blocks for electrical circuits and particularly to terminal blocks which may be programmed and/or reprogrammed in the field to interconnect a plurality of input and output circuits. More specifically, this invention is directed to the establishment of electrical connections between individual input circuits and individual output circuits in accordance with a predetermined program and to facilitating the establishment of a different arrangement of circuit connections if and when dictated by a revision of the program. Accordingly, the general objects of the present invention are to provide novel and improved apparatus and methods of such character.

2. Description of the Prior Art

While not limited thereto in its utility, the present invention has been found to be particularly well suited for use in telephone and security systems wherein individual input lines are to be connected to one or more output lines pursuant to a predetermined pattern or program. By way of example, in a hard-wired fire alarm system it may be desirable to connect a single incoming line from a sensor device to outgoing lines connected to annunciators at a plurality of guard stations. Connector or matrix blocks having the capability of establishing connections of the type briefly described above are known in the art as exemplified by the disclosures of Rosenberg et al. U.S. Pat. Nos. 3,437,740, and 3,539,873.

Prior art matrix blocks have been possessed of a number of inherent deficiencies. The principal deficiencies have resided in the fact that prior matrix blocks have not been repairable in the field and have either been difficult or impossible to program and reprogram in the field; reprogramming usually requiring the unsoldering and resoldering of "jumpers". A second prevalent deficiency of prior art matrix blocks has resided in their construction which placed terminals and other components in an exposed location where they have been readily subjected to accidental damage or the undesired establishment of an open or closed circuit condition by service personnel working on nearby equipment. Since prior art matrix blocks have not been field repairable, this has posed a major problem from an economic viewpoint. Still further disadvantages of prior art matrix blocks resided in their comparatively high initial cost and large size which was not suitable for rack mounting.

SUMMARY OF THE INVENTION

The present invention overcomes the above briefly discussed and other deficiencies and disadvantages of the prior art by providing a novel and improved matrix block which may be easily repaired, programmed and reprogrammed in the field. Matrix blocks in accordance with the present invention comprise a plastic block or housing formed from a self-extinguishing material and may include "fanning strips" which function as wire guides for the leads from plural input and output circuits. A matrix block in accordance with the present invention further comprises a removable retainer plate, also comprised of a self-extinguishing plastic, which holds a plurality of spacially displaced parallel rows of quick-connect terminals in proper position in the block. Pin extensions of some of the terminals extend through apertures provided in the retainer and these pins may be bused together at the exterior surface of the matrix block assembly; the bus conductors thus defining "columns" in the matrix. Additional rows of quick-connect terminals are commoned within the matrix block assembly, typically by means of being formed as an integral stamping, and these integral rows of terminals, which are not provided with pins which extend outwardly through the retainer, are oriented transversely to the bus conductors to define the row conductors of the matrix.

The pair of contact fingers which in part define each of the quick-connect terminals extend into a channel defined on the surface of the matrix block by the fanning strips; the fanning strips running generally parallel to the bus conductors on the opposite side of the assembled matrix block. The matrix block is typically arranged with the rows of plural individual and plural integral quick-connect terminals alternating and programming is accomplished by inserting the leads on interconnection devices, for example pigtails extending from diodes, between the fingers of terminals corresponding to the rows and columns of the matrix to thereby selectively couple rows to columns. The interconnecting devices, the diodes for example, are easily replaceable without resort to soldering and will lay flat against the bottom of the channel defined by the plastic block whereby they are not readily susceptible to accidental dislodging or damage.

BRIEF DESCRIPTION OF THE DRAWING

The present invention may be better understood and its numerous objects and advantages will become apparent to those skilled in the art by reference to the accompanying drawing wherein like reference numerals refer to like elements in the several figures and in which.

DESCRIPTION OF THE PREFERRED EMBODIMENT

Figure 1:
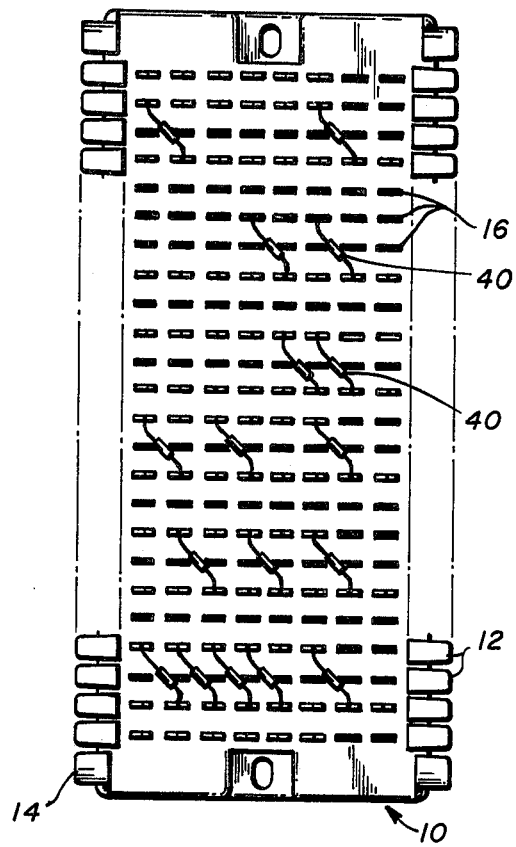
FIG. 1 is a front plan view of a matrix block in accordance with a preferred embodiment of the present invention.

With reference to the drawing, and particularly to FIG. 1, a matrix block in accordance with a preferred embodiment of the present invention comprises a self-extinguishing molded plastic body, indicated generally at 10, which includes a pair of fanning strips 12 and 14 disposed along opposite edges thereof. Strips 12 and 14 cooperate to define a channel 13 (FIG. 6) which runs along the face of body 10 which may be seen in FIG. 1. The configuration of fanning strips 12 and 14 may best be seen from a joint consideration of FIGS. 5 and 6. As may best be seen from FIG. 6, body 10 has, on the side opposite to that from which the fanning strips extend, a hollow recessed portion 15. Communication between the recessed portion 15 of body 10 and the channel 13 defined by the fanning strips is via a plurality of parallel rows of apertures 16. In accordance with a preferred embodiment, as shown in the drawing, the apertures 16 are of rectangular shape.

Figure 2:
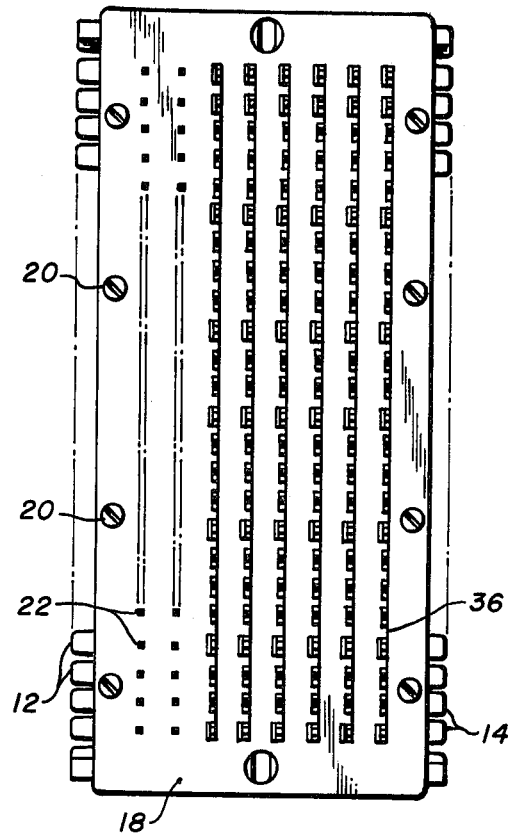
FIG. 2 is a rear plan view of a matrix block of FIG. 1.
Figure 5:
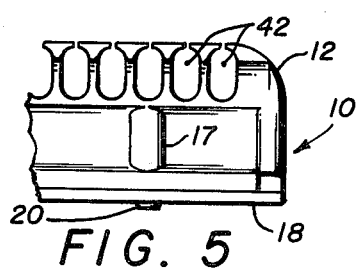
FIG. 5 is a partial side elevation view of the matrix block of FIGS. 1 and 2.
Figure 6:
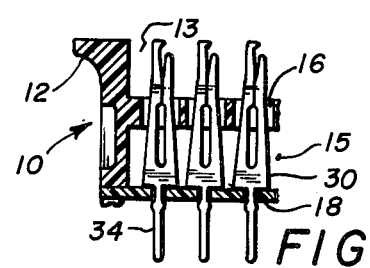
FIG. 6 is a partial cross-sectional view of the matrix block of FIGS. 1 and 2.
Figure 3:
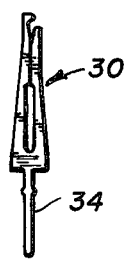
FIG. 3 is a side elevation view of one of the individual quick-connect terminals which is received in the matrix block of FIG. 1.
Figure 4:
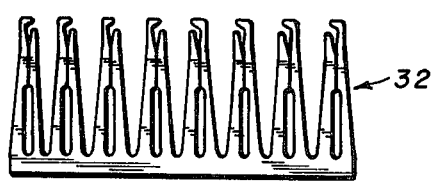
FIG. 4 is a side elevation view of a plurality of commoned quick-connect terminals which may be employed as a row conductor of the matrix block of FIGS. 1 and 2.

Body 10 is also provided with a plurality of reinforced portions 17 which are tapped to receive threaded fasteners. Referring to FIGS. 2, 5 and 6, a matrix block in accordance with a preferred embodiment of the present invention will also include a retainer plate 18 which is usually comprised of the same material as body 10. As may be seen from FIG. 2, plate 18 will be held in position on body 10 by means of screws 20 whereby the matrix block is easily assembled and disassembled for repair purposes and particularly to replace or reposition the quick-connect terminals which are shown in FIGS. 3 and 4. The retainer plate 18 is provided with an array of apertures 22 which, in the embodiment shown in the drawing, are of square shape. The apertures 22 are in alignment with the apertures 16 in body 10 with the matrix block assembled and thus apertures 22 also define parallel rows.

In the course of assembly and/or repair of the matrix block, rows of individual quick-connect terminals, such as the terminal 30 of FIG. 3, and commoned or plural integral quick-connect terminals, such as the terminal strip 32 of FIG. 4, are mounted in body 10 by means of having the portions of the terminals with the opposed connecting fingers inserted through the apertures 16 as shown in FIG. 6. For a more complete discussion of the functioning of the quick-connect terminals, reference may be had to U.S. Pat. No. 3,836,942. The individual terminals 30 and the terminal strips 32 are held in the matrix block by means of the retainer plate 18. The pin extensions 34 of the individual terminals 30 will, when retainer 18 is attached to body 10, extend through apertures 22; this arrangement again being visible from FIG. 6.

The assembly of a matrix block in accordance with the present invention also consists of interconnecting pin extensions 34 of individual of the terminals 30. This interconnection is accomplished by means of push-on type bus strips, such as strip 36 of FIG. 2. The push-on bus bars 36 electrically interconnect the individual terminals 30 in columns which, in the disclosed embodiment, are physically oriented transversely of the rows established by the integral multiple terminals 32.

The multiplicity of rows of apertures 16 and 22 afford wide latitude in the number of connections which may be made employing the matrix block of the present invention. Additionally, in a typical installation there will be a row of the individual terminals 30 at each end of the matrix block. The bared ends of leads from individual of a plurality of input or output circuits are mechanically captured by the terminals at a first end of the matrix block and the terminals at the opposite end of the block may be employed as a multiplying point for extending the capacity of the matrix unit. Similarly, the plural integral terminals 32 will typically have at least two terminals, typically at opposite ends of the strip, in addition to the number of individual terminals 30 in a row. A terminal at a first end of each of the terminal strips 32 will receive the lead from an input or output circuit and the terminals at the other end of each row may serve as a multiplying point.

A matrix block in accordance with the present invention is programmed by selectively electrically connecting individual of the commonly bused column terminals 30 to a row terminal 32. As shown in FIG. 1, this interconnection is accomplished by means of the installation of diodes 40; the pigtails from the diodes being mechanically captured by the fingers of the terminals 30 and 32 to establish an electrical connection between preselected rows and columns. As will be obvious to those skilled in the art, the matrix block of the present invention may be initially programmed and also may be reprogrammed in the field merely by insertion and removal of the diodes 40 as necessary or desired. In a telephone system, bare wire straps can be substituted for a diode at the proper crosspoint on the matrix block where only one ringer is to be connected to one line. In initially wiring the matrix block, at or prior to installation in a rack and prior to programming for example, the circuit leads which are connected to the row and column conductors will be brought into the channel defined on body 10 via the spaces 42 between the members which form the fanning strips 12 and/or 14.

In a telephone system, the matrix blocks of the present invention may be used to control station ringers through the use of programming diodes and/or the matrix blocks may be programmed for pre-set conference hookups. The use of the matrix blocks of the present invention enables the service technician to reprogram the system, pursuant to the customer's request, in a matter of seconds and without interrupting any other circuits by merely removing diodes and/or inserting diodes in new locations. Also, should a terminal be damaged, the matrix block may easily be repaired in the field. The matrix blocks of the present invention also have utility in security systems such as, for example, fire or burgular alarms which are tied into a telephone system. Again by way of example, four row conductors could respectively be connected to a telephone ringing circuit, a burgular alarm, a temperature sensor and a smoke detector and the matrix blocks can be programmed such that all four of these input lines are connected to a single output line which causes energization of an annunicator at an emergency station.

While a preferred embodiment has been shown and described, various modifications and substitutions may be made thereto without departing from the spirit and scope of the invention. Accordingly, it will be understood that the present invention has been described by way of illustration and not limitation.

What is claimed is:

1. An electrical circuit matrix block comprising:

housing means, said housing means being at least partly fabricated from nonconductive material and having an interior portion defined by a pair of opposed members and a pair of side walls, said opposed members each having planar exposed face portions and being provided with an array of apertures in said planar portions, said apertures being arranged in transversely oriented rows and columns;

a first plurality of conductive terminal elements positioned within said housing means, the terminal elements of said first plurality each including connector means which extends outwardly through an aperture in one of said members above the face portion thereof for releasably engaging a conductor, the terminal elements of said first plurality also each having an extension which projects outwardly through an aperture in said second member above the face portion thereof, elements of said first plurality being situated in spaced apart rows of said apertures;

a second plurality of conductive terminal elements positioned within said housing means, the terminal elements of said second plurality each including connector means which extends outwardly through an aperture in said one of said members above the face portion thereof for releasably engaging a conductor, elements of said second plurality being situated in rows of said apertures located intermediate the rows in which the elements of said first plurality are situated;

means within said housing means for electrically connecting groups of said terminals of said second plurality to define matrix row conductors; and bus bar means positioned to the exterior of said housing means and engaging the extensions of said terminal elements of said first plurality to electrically interconnect groups of said first terminal elements to define matrix column conductors whereby rows and columns of said matrix may be selectively electrically coupled by inserting circuit elements in connector means of the terminal elements of said first and second plurality.

2. The apparatus of claim 1 wherein terminal elements of said second plurality and the means connecting said terminal elements in groups to define each row conductor are integral.

3. The apparatus of claim 1 wherein said housing means comprises:

block means, said block means being comprised of plastic and having said apertured one member on one side thereof, a second opposite side of said block means being provided with a recessed face portion with which said apertures communicate; and retainer means, said retainer means being releasably affixed to said block means and covering said recessed face portion thereof when so affixed; said retainer means defining said apertured second member.

4. The apparatus of claim 3 wherein said block means further comprises:

a pair of spaced projections extending outwardly from said one side of said block means, said projections extending along opposite edges of said block means to define a channel in which said apertures terminate.

5. The apparatus of claim 4 wherein terminal elements of said second plurality and the means connecting said terminal elements in groups to define each row conductor are integral.

6. The apparatus of claim 5 wherein said bus bar means extend parallelly of said projections on said block means.

7. The apparatus of claim 6 wherein said projections on said block means define passages for conductors from circuits to be electrically coupled via said matrix block.

8. The apparatus of claim 7 further comprising:

electrical circuit elements selectively bridging connector means of individual terminal elements of said first and second plurality to interconnect rows and columns of the matrix.

9. The apparatus of claim 8 wherein at least some of said electrical circuit elements are diodes.

* * * * *